United States Patent [19]
Zambrano

[11] Patent Number: 5,631,177
[45] Date of Patent: *May 20, 1997

[54] PROCESS FOR MANUFACTURING INTEGRATED CIRCUIT WITH POWER FIELD EFFECT TRANSISTORS

[75] Inventor: Raffaele Zambrano, San Giovannila Punta, Italy

[73] Assignees: SGS-Thomson Microelectronics, S.r.l., Agrate Brianza; Consorzio per la Ricerca sulla Microelecttronica nel Mezzogiorno, Catania, both of Italy

[*] Notice: The term of this patent shall not extend beyond the expiration date of Pat. No. 5,474,944.

[21] Appl. No.: 380,725

[22] Filed: Jan. 30, 1995

Related U.S. Application Data

[63] Continuation of Ser. No. 987,759, Dec. 7, 1992.
[51] Int. Cl.[6] .................... H01L 21/33; H01L 21/336
[52] U.S. Cl. .................... 438/138; 438/268; 438/273
[58] Field of Search .................... 437/41 DM, 44, 437/61, 154, 41 GS, 40 DM, 27–30; 257/328, 329, 346; 148/DIG. 26

[56] References Cited

U.S. PATENT DOCUMENTS

| | | | |
|---|---|---|---|
| 4,757,032 | 7/1988 | Contiero | 357/23.4 |
| 4,890,142 | 12/1989 | Tonnel et al. | 357/23.4 |
| 4,902,636 | 2/1990 | Akiyama et al. | 437/40 DM |
| 5,055,895 | 10/1991 | Akiyama et al. | 357/67 |
| 5,077,228 | 12/1991 | Eklund et al. | 437/40 DM |
| 5,273,917 | 12/1993 | Sakurai | 148/DIG. 126 |
| 5,273,922 | 12/1993 | Tsoi | 437/41 DM |
| 5,306,652 | 4/1994 | Kwon et al. | 437/44 DM |
| 5,376,968 | 12/1994 | Yang | 437/40 DM |
| 5,475,273 | 12/1995 | Paparo et al. | 327/545 |

FOREIGN PATENT DOCUMENTS

| | | | |
|---|---|---|---|
| 62-47162 | 2/1987 | Japan | 437/40 DM |
| 2-51278 | 2/1990 | Japan | 437/40 DM |

OTHER PUBLICATIONS

Wolf, S., *Silicon Processing for the VLSI Era* Lattice Press, Sunset Beach, CA, vol. 2, pp. 298–301.

*Primary Examiner*—John Niebling
*Assistant Examiner*—S. Mulpuri
*Attorney, Agent, or Firm*—Robert Groover; Betty Formby

[57] ABSTRACT

A manufacturing process for an integrated circuit which includes at least one vertical-current-flow MOS transistor. The patterned photoresist which screens the body implant is also used to mask the etching of a nitride layer over a pad oxide. After the photoresist is cleared, the nitride pattern is transferred into the oxide, and the resulting oxide/nitride stack is used to mask the source implant. The nitride/oxide stack is then removed, the gate oxide is grown, and the gate layer is then deposited.

13 Claims, 4 Drawing Sheets

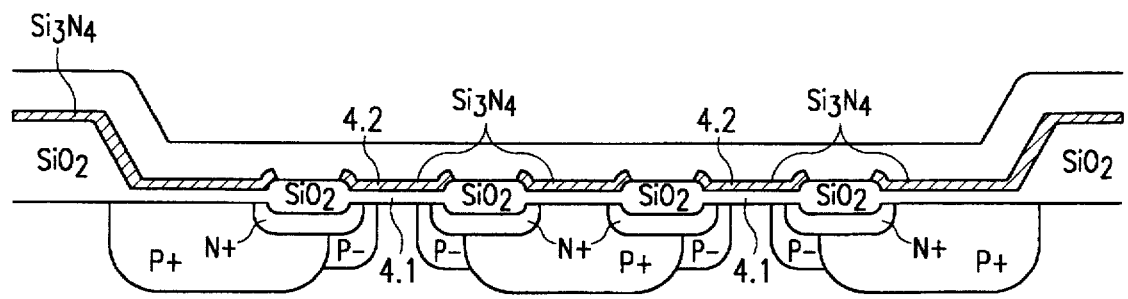
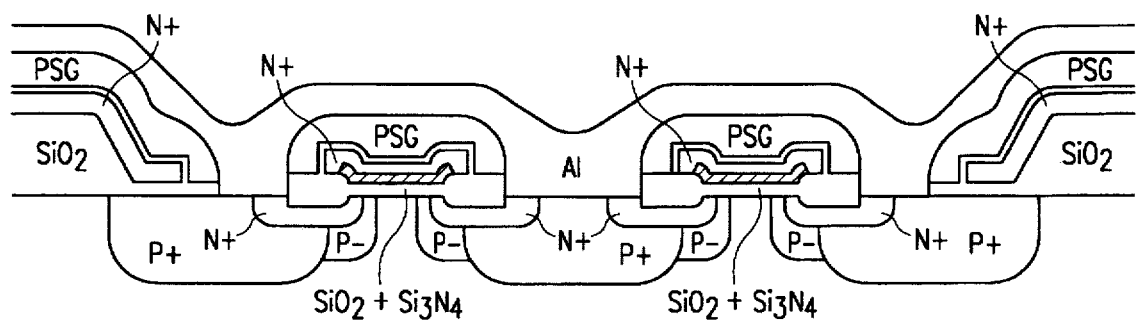
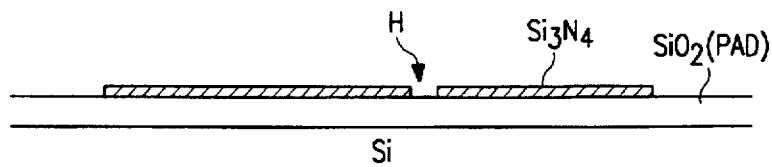
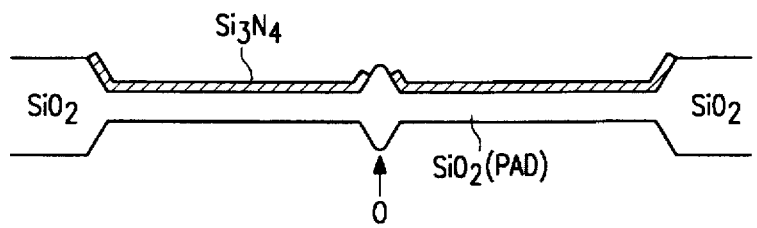
FIG. 10
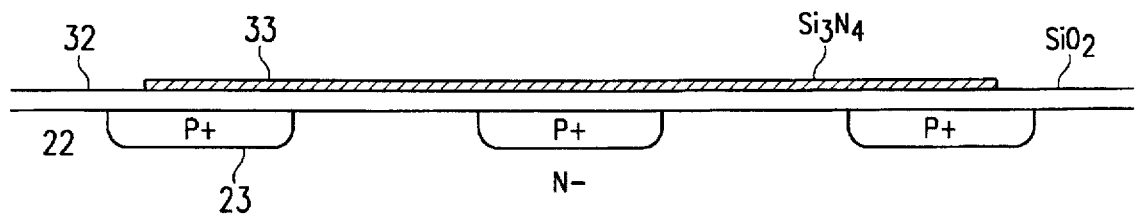
FIG. 11

PROCESS FOR MANUFACTURING INTEGRATED CIRCUIT WITH POWER FIELD EFFECT TRANSISTORS

This is a continuation application of Pending App'n Ser. No. 07/987,759, filed Dec. 7, 1992.

BACKGROUND AND SUMMARY OF THE INVENTION

The present invention relates to manufacturing processes for integrated circuits which include one or more insulated gate field effect transistors with vertical current flow ("power IGFETs" or "power MOS devices"), possibly in combination with other devices.

The manufacturing process for a power IGFET involves a series of operations, including epitaxial growth of an N– silicon layer on an N+ monocrystalline silicon substrate, surface oxidation of said layer for formation of the field oxide, definition of the deep body region and the active areas of the device, growth of a gate oxide layer, deposit and doping of a polycrystalline silicon layer and definition of the gate, body and source regions.[1]

[1] See, e.g., B. J. Baliga, MODERN POWER DEVICES (1987), POWER INTEGRATED CIRCUITS; PHYSICS, DESIGN, AND APPLICATIONS (ed. Paolo Antognetti, 1986); all of which are hereby incorporated by reference.

One frequent shortcoming is the presence in the gate oxide of the finished device of fractures ("pinholes"), which cause deviations because they generate short circuits between the gate polycrystalline silicon and the body and source regions below. Short circuits can also be generated between the gate polycrystalline silicon and the type N epitaxial layer underlying the gate oxide, thus causing short circuiting of the gate with the drain.

The present invention advantageously avoids this shortcoming by providing a process with reduced danger of short circuits between gate and source of the device.

The disclosed invention provides a process wherein the operations of definition and diffusion of the body and source regions are performed before deposit of the gate polycrystalline silicon layer.

BRIEF DESCRIPTION OF THE DRAWING

The present invention will be described with reference to the accompanying drawings, which show important sample embodiments of the invention and which are incorporated in the specification hereof by reference, wherein:

FIGS. 8, 9 and 10 show cross sections of an IGFET at the end of some processing phases of a second example of a process in accordance with the present invention, and FIGS. 11–12 show cross sections of an IGFET at the end of the first phases of a variant of the first and second examples of a process in accordance with the present invention.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
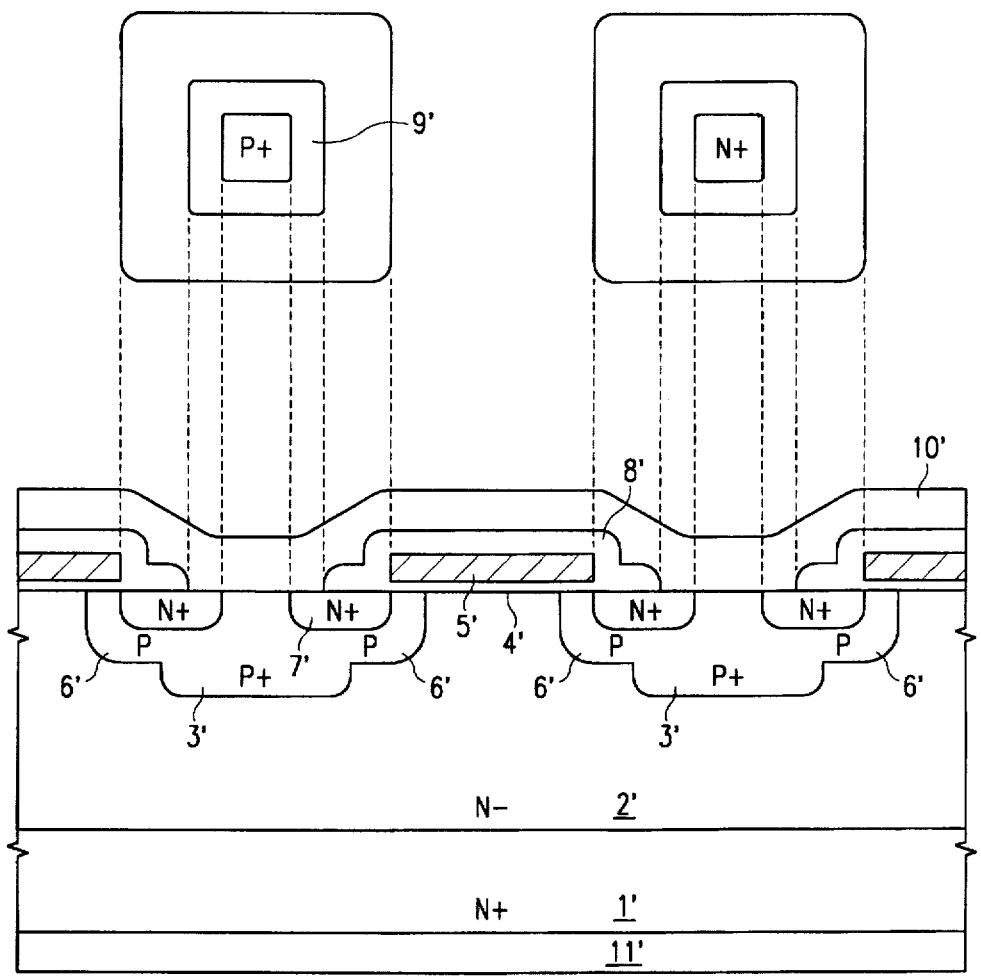
FIG. 1 shows an example of a structure for an IGFET.

FIG. 1 shows an example of a structure of an IGFET.

A standard process for accomplishment of said structure calls for the following phases:

epitaxial growth of a layer 2' of N– silicon on a substrate 1' of low resistivity type N+ monocrystalline silicon, surface oxidation of the layer 2' (to produce field oxide isolation regions, not shown), formation of a P-type layer with high dopant concentration, for the deep body region 3', by three successive operations of masking, implantation and diffusion, definition by masking of the active areas of the device, growth of a layer of gate oxide ($SiO_2$) on the active areas (of which at the end of the process there remains a trace in the layer 4' underlying the gate polycrystalline silicon 5'), deposit and doping of a polycrystalline silicon layer on the gate oxide, definition of the gate regions by selective etching of the polycrystalline silicon, definition of the body region 6' (type P) and source regions 7' (type N) for formation of the power MOS channel, deposit of an oxide layer 8' (PSG) on the polycrystalline silicon to completely insulate it, definition of the contact area 9', metallization 10' of the front, covering of the metallization with glass or other passivating materials (not indicated in the figures), and metallization 11' of the back of the device.

Although the above process allows self-alignment of the gate polycrystalline silicon with the body and source regions (and hence with the channel region), it frequently gives rise, as mentioned above, to "pinholes" in the gate oxide layer 4'.

Figure 2:
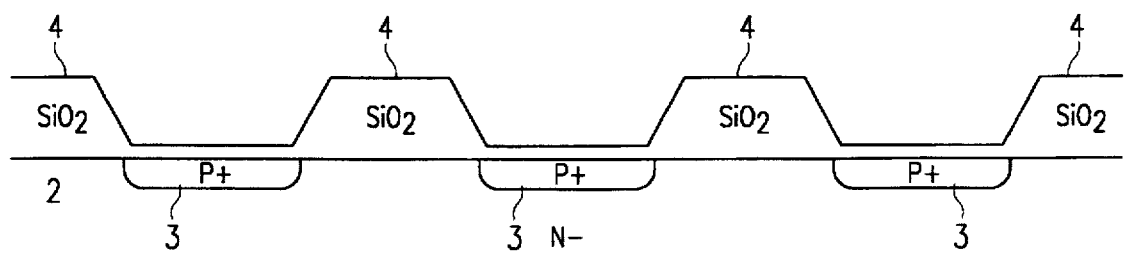
FIGS. 2–7 show cross sections of an IGFET in different processing phases of a first example of a process in accordance with the present invention.

A first example of an embodiment of the process in accordance with the present invention is now described with reference to FIGS. 2–7 which illustrate a cross section of an IGFET in different processing phases, including:

1) Epitaxial growth of a type N– silicon layer 2 on an N+ low resistivity monocrystalline substrate (not shown in FIG. 2). In a sample embodiment, this is performed to a thickness of 10 microns with a average net dopant concentration of $5 \cdot 10^{15}$ $cm^{-3}$.

2) Surface oxidation of the slice with formation of the field oxide 4 ($SiO_2$). In a sample embodiment, this is performed to a thickness of 1.5 microns.

3) Three successive operations of masking, implantation and diffusion for definition of a type P layer 3 with high dopant concentration designed for formation of the deep body. In a sample embodiment, this is performed to a thickness of 2 microns. (FIG. 2 represents a cross section of the device at the end of this phase.)

4) Photolithography of the field oxide.

5) Growth of the pad oxide 12. In a sample embodiment, this is performed to a thickness of 0.08 microns.

Figure 3:
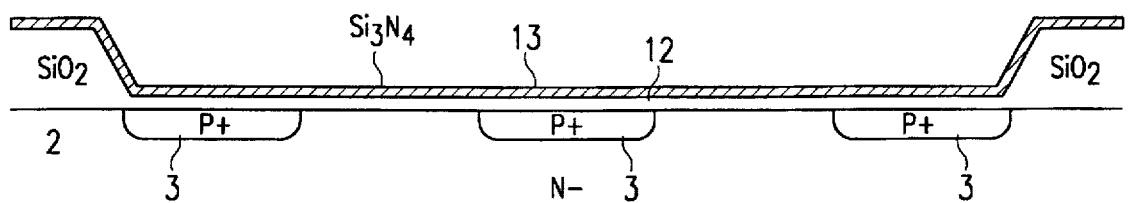

6) Deposition of a layer 13 of nitride $Si_3N_4$ on the pad oxide. In a sample embodiment, this is performed to a thickness of 0.1 microns. (FIG. 3 represents a cross section of the device at the end of this phase).

7) Deposition and photolithography to provide a photoresist layer with apertures corresponding to the desired locations of the body region 6 and source region 7 (with allowance for lateral diffusion).

8) Etching of the layer 13 of $Si_3N_4$. In a sample embodiment, this is performed with an etch chemistry of $CF_4+CF_3Br+O_2$ at a total pressure of 100 mTorr.

9) Ion implantation of the body (P−). In a sample embodiment, this is performed with a dose of $8 \cdot 10^{13}$ $cm^{-2}$ of boron at an energy of 80 keV.

10) Removal of the resist layer deposited during photolithography step (7).

Figure 4:
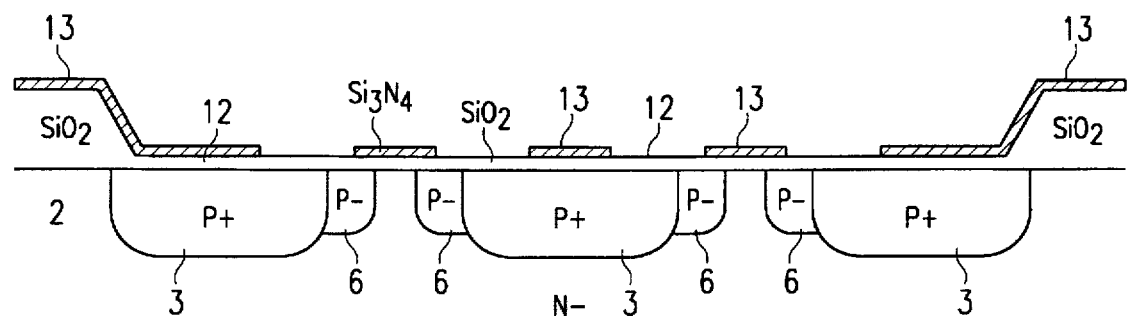

11) Diffusion of the P− dopant which will serve to form the P− body and channel zones. In a sample embodiment, this is performed for 200 minutes at a maximum temperature of 1150° C. (FIG. 4 represents a cross section of the device at the end of this phase).

12) Etching of the pad oxide 12 in the zones not covered by the nitride 13. (This will still be in the same pattern which was defined by photolithography step (7), exposing the central parts of the body and source regions.) In a sample embodiment, this is performed with an wet etch (buffered HF).

Figure 5:
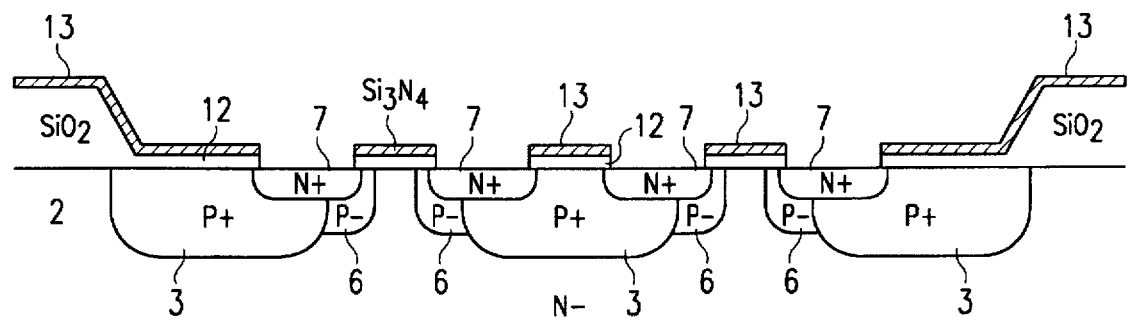

13) Implantation of dopant (n+) to form the source 7. In a sample embodiment, this is performed with a dose of $5 \cdot 10^{15}$ $cm^{-2}$ of arsenic at an energy of 80 keV. This implant will be stopped by the oxide 12 and nitride 13 wherever these remain in place. (FIG. 5 represents a cross section of the device at the end of this phase).

14) Diffusion of the dopant N+ (source) accompanied by surface oxidation for formation of the channel. In a sample embodiment, this is performed for 100 minutes at a maximum temperature of 1000° C., first in an atmosphere of dry nitrogen, and then in an oxidizing ambient (e.g. wet $O_2$).

15) Removal of the layer 13 of $Si_3N_4$. In a sample embodiment, this is performed with an etch chemistry of hot phosphoric acid.

16) Removal of the pad oxide 12. In a sample embodiment, this is performed with an etch chemistry of buffered HF.

17) Growth of the gate oxide 4 ($SiO_2$). In a sample embodiment, this is grown to a thickness of 0.08 microns.

18) Deposit of the polycrystalline silicon 5 on the gate oxide 4. In a sample embodiment, this is performed to a thickness of 0.5 microns.

Figure 6:
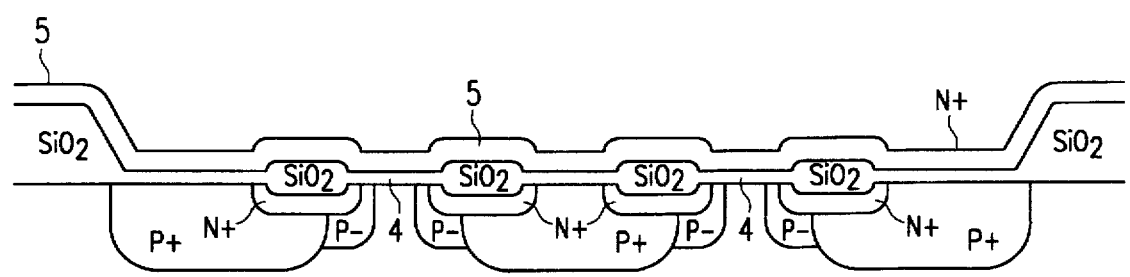

19) Doping of the polycrystalline silicon (FIG. 6 represents a cross section of the device at the end of this phase). In a sample embodiment, this is performed by $POCl_3$ deposition.

20) Photolithography and etching of the polycrystalline silicon on the front of the slice except the gate regions.

21) Oxidation of the polycrystalline silicon, to form a thin layer 14.

22) Deposit of a layer 15 of oxide (PSG) on the polycrystalline silicon to completely insulate it.

23) Photolithography and etching of the contacts (contact areas 16). In a sample embodiment, this is performed with an etch chemistry of $CHF_3+C_2F_6$ (after deglaze in buffered HF).

24) Deposition of metallization 10 on the front of the slice.

25) Photolithography and etching of metal 10. (FIG. 7 represents a cross section of the device at the end of this phase.)

Figure 7:
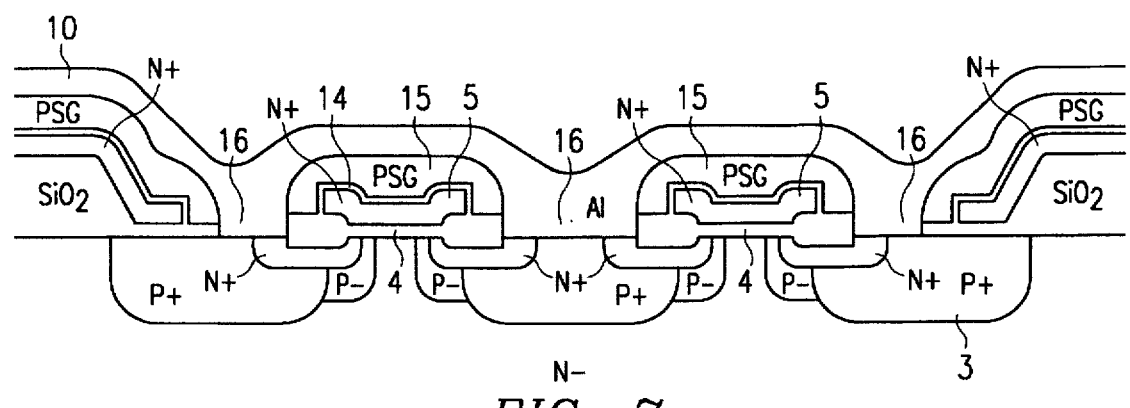

26) Covering of the metallization with glass or other passivating materials (not shown in FIG. 7).

27) Metallization of the back of the slice (not shown in FIG. 7).

As seen in this first sample process embodiment, definition and diffusion of the body and source regions takes place before deposit of the gate polycrystalline silicon. This is made possible by using, for definition of the body and source regions, a layer of pad oxide and a layer of silicon nitride overlying it. These layers allow self-alignment of the body and source regions, and are subsequently removed before growth of the gate oxide and deposit of the gate polycrystalline silicon.

A second example of a process in accordance with the present invention calls for the same phases as the first example, except that phases (15), (16), and (17) are omitted. In this case also definition and diffusion of the body and source regions takes place before deposit of the gate polycrystalline silicon. Again, this is made possible by using, for definition of the body and source regions, a layer of pad oxide and a layer of silicon nitride overlying it. These layers allow self-alignment of the body and source regions; but instead of being subsequently removed, these layers are also used as gate dielectric in place of the gate oxide, whose formation can therefore be omitted.

FIG. 8 shows the cross section of the device, in this embodiment, as it appears at the end of the phase (19). This cross section differs from that of FIG. 6 in that the layer 4 of FIG. 6 (gate oxide) has been replaced by the group formed by the layers 4.1 and 4.2 of pad oxide and nitride respectively.

The final structure of the device, in this embodiment, is shown in FIG. 9.

A third example of a process in accordance with the present invention comprises the same phases as the first example except the phases (6), (8), and (15), which call for deposit of a layer of polycrystalline silicon (instead of nitride), and for etching and removal thereof respectively after implantation and diffusion of the source. Again in this case, as for the previous cases, definition and diffusion of the body and source regions takes place before deposit of the gate polycrystalline silicon. This is made possible, in this embodiment, by using for definition of said regions a layer of pad oxide and a layer of polycrystalline silicon overlying it which are removed before growth of the gate oxide and deposit of the gate polycrystalline silicon. In this manner the necessity of equipment for deposit and etching of the layer of $Si_3N_4$ is avoided.

For all three of the above examples, definition and diffusion of the body and source regions before deposit of the gate polycrystalline silicon gives the following advantages:

I) The gate oxide which grows on the source regions (phase 14) is thicker than in the other regions, since the speed of growth of the oxide on top of a strongly doped type N region is higher. Consequently: a) there is reduced possibility of occurrence of "pinholes" in the gate dielectric, i.e. reduced possibility of occurrence of short circuits between gate and source in this region, and b) there is reduced parasitic capacitance between these two regions.

II) The body and source regions are self-aligned with each other because they are implanted through the same geometry, defined by the body/source photolithography.

In addition, compared with the first and third examples there are also additional advantages, as made clear by the following considerations.

The considerable presence of "holes" in the gate oxide of the devices obtained by the known process can be attributed to the fact that, in this process, the thermal cycles which follow deposit of the polycrystalline silicon layer subject the gate oxide to a series of mechanical stresses, due to the different thermal expansion coefficients of the three materials present here (monocrystalline silicon, thin gate oxide, and polycrystalline silicon). The stress induced on the thin gate oxide layer, which in general is no thicker than 0.1 micron, is consequently released not only elastically but also inelastically, giving rise to yielding and fractures ("holes") in said layer.

By contrast, the inventive process of the first and third embodiments above do not subject the structure of the device to such mechanical stresses, since the thermal cycles necessary for accomplishment of the body and source regions take place before growth of the gate oxide and deposit of the polycrystalline silicon. This helps achieve a low density of short circuits between gate and source/drain of the IGFETs.

The second embodiment above also provides advantages over the standard process. The combination of the two gate dielectrics (oxide+nitride) used in the second example is intrinsically stronger than the single layer of gate oxide, and this helps to significantly reduce the density of short circuits between gate and drain and between gate and source. Indeed:

- the nitride (often only approximately 0.1 micron versus the thickness of approximately 0.5 micron of the polycrystalline silicon) subjects the underlying oxide to less stress and, even in the eventuality of yielding of the latter, the defects in the oxide are covered by a layer of insulating material (the nitride);

- the presence of any "pinholes" in the nitride is not a big problem because opposite these holes grows a rather thick oxide during phase 14 of N+ diffusion/oxidation (the mechanism of this oxide growth opposite holes in the nitride is exemplified in FIG. 10, which shows how the hole H present in the nitride before said phase 14 is filled by the oxide O at the end of said phase).

Process Integration

Figure 13:
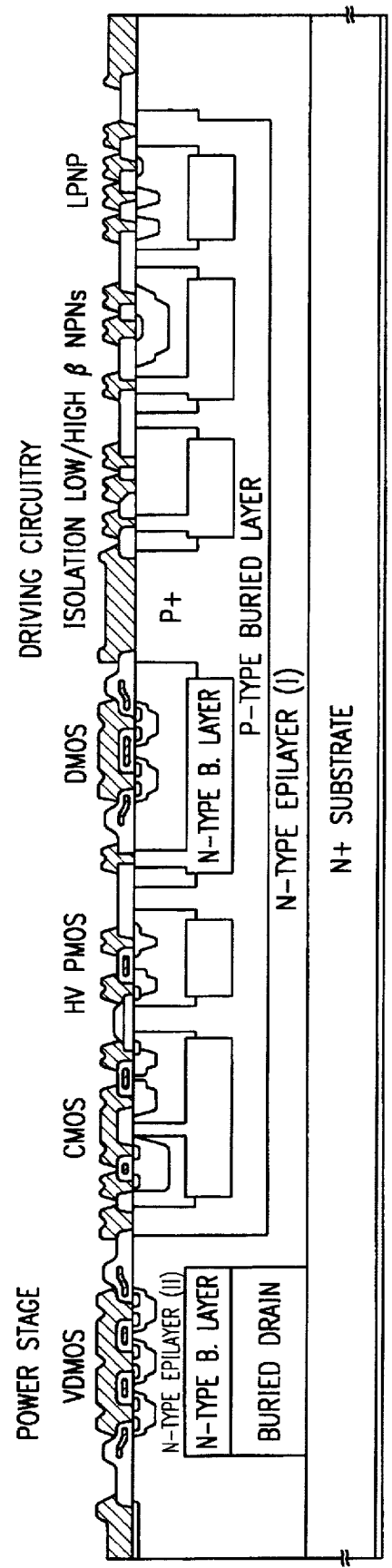
FIG. 13 is a composite device cross-section, showing the various device structures produced by a smart power process according to the detailed description below.

FIG. 13 is a composite device cross-section, showing the various device structures produced by a smart power process according to the detailed description above. The specific process steps described above form the VDMOS and DMOS devices.

The steps which form the n+ source regions referenced above are also used to form the source/drain regions of the NMOSFETs (in the CMOS regions), and the n+ emitter regions for the NPN transistors. (Note that the sample embodiment of FIG. 13 includes both low-β and high-β NPN devices.)

The steps which form the p– body regions referenced above are also used to form the source/drain regions of the PMOSFETs (in the CMOS regions), and to form the base of the NPN devices.

The steps which form the p+ deep-body regions referenced above are also used to form the P-type contact regions, and to form emitter/collector regions for the lateral PNP transistors LPNP.

The steps referenced above which form the gate oxide and polysilicon layers are also used for corresponding portions of all the CMOS devices.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

It is clear that to the examples of embodiment described above by way of non-limiting illustration can be made numerous modifications, adaptations and variants and substitutions can be made without thereby going beyond the scope of the present invention.

In accordance with one such variant, phases 1 to 6 of the first and second examples can be varied by taking advanage of the presence of the layer of nitride $Si_3N_4$ to define the active area of the device by a selective oxidation process called LOCOS (LOCal Oxidation of Silicon). Said phases are modified as follows:

1) Epitaxial growth of a layer 22 of type N– silicon on a type N+ low resistivity monocrystalline substrate (not shown in FIG. 11) and subsequent growth of the pad oxide 32.

2) Photolithography to define the deep body region and subsequent ionic implantation of the deep body 23 (P+)

3) Removal of the resist layer deposited during the photolithography of the deep body.

4) Deposit of a layer 33 of $Si_3N_4$.

5) Photolithography for growth of the field oxide and etching of the layer 33 of $Si_3N_4$ (FIG. 11, replacing FIG. 2, represents a cross section of the device at the end of this phase).

Figure 12:
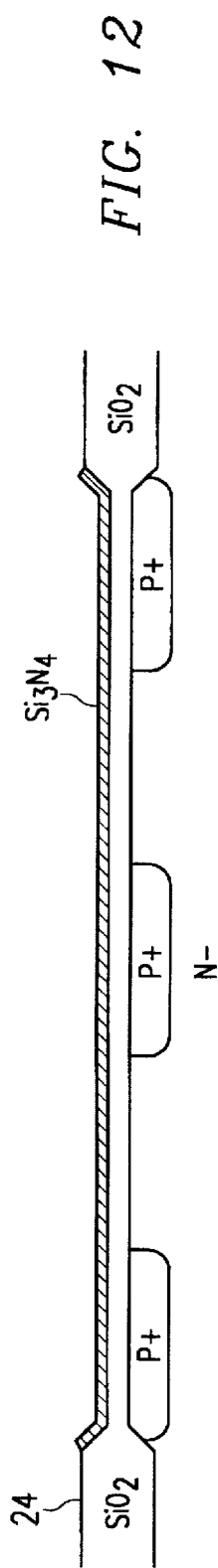

6) Growth of the field oxide 24 (FIG. 12, replacing FIG. 3, represents a cross section of the device at the end of this phase).

In accordance with another variant in the process set forth in the first and third examples growth of the gate oxide (phase 17) can be preceded by growth and subsequent removal of a thin layer of so-called sacrificial oxide. As is conventional, this is done to eliminate any short circuits between gate and source due to the "white ribbon" or Kooi effect.

It is also emphasized that it is possible to use techniques for the formation of self-aligned silicides to increase the integration density.

It is observed that although processes for an n-channel transistor have been described, the disclosed process steps can be applied, with obvious variants, also to p-channel transistors: in this case it suffices to interchange all the type p regions with type n regions. Of course said transistors can be provided both discretely and in the framework of integrated circuits.

It is also possible to use the processes in accordance with the present invention to provide conductivity modulation devices, known as IGBTs (Insulated Gate Bipolar Transistors). See, e.g., Laska et al., "A 2000 V-non-punch-through-IGBT," IEDM TECHNICAL DIGEST p.807–10 (1990); Mori et al., "An insulated gate bipolar transistor with a self-aligned DMOS structure," IEDM TECHNICAL DIGEST p.813–16 (1988); Baliga et al., "New cell designs for improved IGBT safe-operating-area," IEDM TECHNICAL DIGEST p.809–12 (1988); all of which are hereby incorporated by reference. In this case it is necessary to replace the type n+ substrate by a type p+ substrate in accordance with techniques known to those skilled in the art.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A manufacturing process for insulated gate field effect transistors with vertical current flow, comprising the steps of:

epitaxial growth on a monocrystalline silicon substrate of a layer of silicon having a first type of conductivity;

oxidation of said epitaxial layer to produce a field oxide layer;

patterning said field oxide layer to form a mask for implantation of second-conductivity-type dopants, to produce a deep-body region;

exposing said epitaxial layer in active area locations;

definition and implantation of body and source regions; wherein said source region is implanted through an oxidation resistant masking layer, which is also used to mask an oxidation process which forms a thickened oxide over substantially all of said source regions; and growth of a gate oxide layer, and deposition, doping, and definition of a polycrystalline silicon layer thereover, to form a patterned insulated gate layer;

wherein said step of definition and implantation of the body region and source regions is performed before said steps of growth of a gate oxide layer and deposit of the gate polycrystalline silicon layer;

whereby the possibility of occurrence of short circuits between the gate and source regions is reduced and the parasitic capacitance between the gate and source regions is also reduced.

2. The manufacturing process of claim 1, wherein said step of definition and implantation of body and source regions comprises formation of a pad oxide layer and a silicon nitride layer thereover to form said oxidation resistant masking layer and patterning said oxidation resistant masking layer.

3. The manufacturing process of claim 2, wherein said epitaxial layer and said monocrystalline silicon substrate have opposite conductivity types.

4. The manufacturing process of claim 2, wherein said steps of deposition, doping, and definition of said polycrystalline silicon layer are performed after said step of definition and implantation of the body region and source region.

5. The manufacturing process of claim 2, wherein, after said step of definition and implantation of the body region and source region, there follows the steps of removal of the silicon nitride layer, removal of the pad oxide, growth of the gate oxide, and deposit of the gate polycrystalline silicon.

6. The manufacturing process of claim 5, wherein said gate oxide growth step is preceded by growth and subsequent removal of a thin layer of sacrificial oxide.

7. The manufacturing process of claim 5, wherein said epitaxial layer and said monocrystalline silicon substrate have opposite conductivity types.

8. The manufacturing process of claim 2, wherein said step of definition and implantation of the body region and source region is preceded by the steps of:—epitaxial growth on said monocrystalline silicon substrate of said silicon layer having a first type of conductivity and subsequent growth of a layer of pad oxide,—deposit of resist, photolithography to define the deep body regions and subsequent ionic implantation of the deep body,—removal of the resist deposited during photolithography of the deep body,—deposit of a layer of silicon nitride $Si_3N_4$, and—photolithography of the field oxide and etching of said layer of $Si_3N_4$.

9. The manufacturing process of claim 8, wherein said step of gate oxide growth is preceded by growth and subsequent removal of a thin layer of sacrificial oxide.

10. The manufacturing process of claim 8, wherein said epitaxial layer and said monocrystalline silicon substrate have opposite conductivity types.

11. The manufacturing process of claim 1, wherein said step of definition and implantation of body and source regions comprises formation and patterning of an initial polycrystalline silicon layer, and wherein said initial polycrystalline silicon layer is removed after said step of definition and implantation of body and source regions, and wherein said gate oxide is grown thereafter.

12. The manufacturing process of claim 11, wherein said gate oxide growth step is preceded by growth and subsequent removal of a thin layer of sacrificial oxide.

13. The manufacturing process of claim 11, wherein said epitaxial layer and said monocrystalline silicon substrate have opposite conductivity types.

* * * * *